(12) United States Patent
Grosse et al.

(10) Patent No.: US 7,771,798 B1
(45) Date of Patent: Aug. 10, 2010

(54) METHOD FOR PRODUCING COMPOSITE LAYERS USING A PLASMA JET SOURCE

(75) Inventors: Stefan Grosse, Gerlingen (DE); Johannes Voigt, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 1459 days.

(21) Appl. No.: 10/148,842

(22) PCT Filed: Oct. 11, 2000

(86) PCT No.: PCT/DE00/03566

§ 371 (c)(1),
(2), (4) Date: Aug. 7, 2002

(87) PCT Pub. No.: WO01/40542

PCT Pub. Date: Jun. 7, 2001

(51) Int. Cl.
*C23C 16/00* (2006.01)
*H05H 1/24* (2006.01)

(52) U.S. Cl. .................. 427/569; 427/576; 427/446; 427/450; 427/255.7

(58) Field of Classification Search ............... 427/446, 427/450, 452, 454, 569, 255.5, 255.7, 255.23, 427/255.394, 577, 249.1
See application file for complete search history.

(56) References Cited

U.S. PATENT DOCUMENTS 5,116,665 A * 5/1992 Gauthier et al. ............. 428/216

FOREIGN PATENT DOCUMENTS

| DE | 41 12 156 | 10/1992 |
|---|---|---|
| EP | 107428 A2 * | 5/1984 |
| EP | 0 455 996 | 11/1991 |
| EP | 0 577 066 | 1/1994 |
| EP | 577066 A1 * | 1/1994 |
| JP | 2-149412 | 6/1990 |
| JP | 0 481 722 | 4/1992 |
| JP | 5-195107 | 8/1993 |
| WO | WO 97/18341 | 5/1997 |

OTHER PUBLICATIONS

Patent Abstracts of Japan, vol. 014, No. 397 (C-0752), Aug. 28, 1990.
Patent Abstracts of Japan, vol. 017, No. 632 (C-1132), Nov. 24, 1993.
Nobudo et al. "Preparation of Batio3 Films by ICP Flash Evaporation", Journal of the Ceramic Society of Japan, International Edition, Fuji Technology Press, May 1, 1993, pp. 551-555.
S. Veprek et al., Appl. Phys. Lett., 66, (1995), p. 2640ff.

(Continued)

Primary Examiner—David Turocy
(74) Attorney, Agent, or Firm—Kenyon & Kenyon LLP

(57) ABSTRACT

A method is for producing a functional coating, e.g., composite layers or metal alloys, on a substrate using at least one plasma jet source able to be operated in a fine vacuum up to an almost atmospheric pressure range. For this purpose, the plasma jet source produces a plasma, which emerges from the plasma jet source in the form of a plasma jet and acts on a substrate. In this context, at least two precursor materials, which are modified or fused in the plasma jet and subsequently deposited on the substrate, are introduced into the plasma.

17 Claims, 2 Drawing Sheets

OTHER PUBLICATIONS

E. Pfender and C.H. Chang's, "Plasma Spray Jets and Plasma-Particulate Interaction: Modelling and Experiments" symposium volume of minutes from plasma technology workshop VI, TU Illmenau, 1998.

S. Veprek's "Theoretic concept for the design and practical preparation of new, thermodynamically stable, super-hard composite materials", status seminar "Surface and layer technologies", Würzburg, VDI technology center, 1997, vol. 1, pp. 27 and 28.

* cited by examiner

METHOD FOR PRODUCING COMPOSITE LAYERS USING A PLASMA JET SOURCE

FIELD OF THE INVENTION

The present invention relates to a method for producing composite layers using a plasma jet source.

BACKGROUND INFORMATION

In many industry branches, there is a growing need for thin, hard layers having defined physical and chemical properties that are to protect components and surfaces of materials from wear or corrosion. Conventional layers are made of one or more plies having different compositions, quality characteristics, and functionalities.

For this purpose, in conventional plasma spraying methods, powdery, micro-scale particles are introduced in a low vacuum up to an almost atmospheric pressure region into a plasma jet source or a plasma jet, partially fused and vaporized there, and then plated on a substrate in a targeted manner at a high speed. Consequently, layers having different functionalities are deposited at relatively high deposition rates yet do not attain the homogeneity and compactness of typical PACVD layers (physically aided chemical vapor deposition) or CVD layers. However, the advantages of the plasma spraying are the highly localizable coating and high deposition rates.

In plasma spraying, the plasma jet is typically generated using direct voltage. However, new developments using inductive high-frequency coupling-in are also conventional. The latter has the advantage that the introduced powder particles have a longer dwell period in the plasma jet and are consequently more intensely fused.

Therefore, it is described in E. Pfender and C. H. Chang's, "Plasma Spray Jets and Plasma-Particulate Interaction: Modelling and Experiments" symposium volume of minutes from plasma technology workshop VI, TU Illmenau, 1998, to produce a plasma in a plasma jet source via externally applied high-frequency alternating currents and an inductive high-frequency coupling-in using a coil in a cup-shaped, cylindrical torch body, the plasma exiting the plasma jet source in the form of a plasma jet. It is also known from there to use helium, argon, or oxygen as the plasma gas to which a metallic powder may be added, so that, analogously to the known plasma spraying, these particles are superficially fused in the plasma jet, the particles are then deposited on a substrate outside of the plasma source.

The disadvantage of this method is first the high roughness and low mechanical strength of the deposited layers, which is due to the fact that the supplied powder particles in the plasma jet are only subjected to the high plasma temperatures of partially more than 9000 K for a short time due to the high flow velocity of the jet, so that they are not completely fused but only superficially fused. The supplied particles do not fuse and break up to an atomic or molecular level or to the level of nano-scale clusters. Therefore, such layers are not suitable as thin wear-protecting layers or hard material layers having a layer thickness of several micrometers. Furthermore, the composition of such deposited layers has been largely limited to metals and metallic oxides to date.

It is also conventional to deposit thin and high-grade wear-protecting and corrosion-protecting layers from the gas phase in the high vacuum using PACVD processes (physically aided chemical vapor deposition) or PVD processes (physical vapor deposition). PACVD and CVD methods are distinguished by qualitative, high-grade, dense, compact, and homogenous layers. However, the deposition rate is low since the deposition results from atomic growth. S. Veprek's "Theoretic concept for the design and practical preparation of new, thermodynamically stable, super-hard composite materials", status seminar "Surface and layer technologies", Würzburg, VDI technology center, 1997, volume 1, pgs. 27 and 28, describes on the basis of theoretical considerations depositing new, super-hard layers on substrates, e.g., steel substrates, with the help of a plasma CVD or a plasma PVD method. These materials are produced by combining a nano-crystalline, hard transition metal nitride $Me_nN$ with amorphous $Si_3N_4$. The deposition occurs between 500° C. and 550° C. Further details about this concept are described in S. Veprek et al., Appl. Phys. Lett., 66, (1995), pg. 2640ff.

As a result of these nano-crystalline materials in an amorphous matrix, partially the hardness of a diamond is to be able to be achieved according to theoretical calculations.

SUMMARY

The method according to the present invention may provide the advantage that the gaps existing between PACVD processes and plasma spraying processes are filled and at the same time the production of innovative layer systems and materials is made possible.

For this purpose, a plasma jet source in a new process management in a fine vacuum up to an almost atmospheric pressure range renders possible a targeted, local coating process or deposition process on a substrate, the species (precursors) forming the layer are supplied to the plasma jet source or the plasma in the form of gases, fluids, or powders.

Thus, this means that solid precursor materials in the form of nano-particles, nano-scale or micro-scale powders, or suspensions are supplied to the plasma jet source and are fused, vaporized, or broken up in the plasma jet as a function of the dwell period in the plasma or of the initial size of the supplied particles or powder particles, thereby resulting in individual atoms, molecules, or nano-scale to micro-scale clusters or particles that then strike the substrate to the coated in a targeted manner and at a high speed. In this context, gaseous and/or fluid precursor materials may also be simultaneously introduced into the deposition process in addition to solid precursor materials.

Consequently, mixing different precursor materials makes it possible to produce new-type materials and layer systems, the different precursor materials being selected, e.g., such that they are excited, fused, and/or vaporized in the plasma jet source in different manners. For example, this may be achieved by selecting chemically different precursor materials, a different manner of introducing the precursor materials into the plasma, as well as a different location for introducing them into the deposition process or the plasma. Moreover, the precursor materials used may also differ in particle size.

On the whole, this influences in a targeted manner the magnitude and the manner of the energy transfer to the supplied particles or precursor materials in the plasma, and different excitation degrees of this supplied species are established due to the different residence times in hotter or colder zones of the produced plasma or of the so-called afterglow.

Consequently, layer systems, for example, may be prepared in the form of composites made of a mixture of different materials or structural states, e.g., a matrix structure and at least one intercalation.

According to this, the method according to the present invention includes the preparation of new composite layer systems using different precursor materials in a plasma jet source having defined adjustable process conditions, so that the different precursor materials that are adjusted to one another may be processed differently. Consequently, one has the possibility to be able to produce new, qualitatively high-grade, partially hard to super-hard layer systems having adjustable characteristic profiles, an advantage of the method according to the present invention being its versatility with respect to depositing different layer systems.

Moreover, the method according to the present invention is a method having less or in special cases even no expenditure for vacuum technology in comparison with the PACVD method since a fine or low vacuum or often even an almost atmospheric pressure range is sufficient. At the same time, the typically high gas or particle outlet speeds from plasma jet sources are used in order to bring an effective flow of precursor material onto the surface to be coated, thereby achieving significantly higher layer growth rates in comparison with CVD or PACVD methods.

Furthermore, by combining different precursor materials, the method according to the present invention also renders it possible to deposit amorphous metallic alloys, which are not able to be produced in a crystalline form, as well as new, ceramic or metallic-ceramic compounds. In addition, using a plurality of precursor materials having different vaporization and melting temperatures also makes it possible to prepare other innovative metal alloys.

It may be possible to embed nano-crystalline particles, such as nano-crystalline metal nitride, in an amorphous, carbon-containing or hydrocarbon-containing matrix layer, layer properties and layer hardnesses being achieved that were only based on theoretical calculations since a suitable manufacturing method was not yet known. Using the method according to the present invention, it may be possible to produce materials that do not contain the reactive element in both phases, i.e., in the intercalations and the surrounding matrix, as in the case of TiN in $Si_3N_4$.

In addition, in the case of the process temperatures used, one is no longer limited to a narrow temperature window in which there is, for example, a thermodynamic equilibrium to the advantage of the formation of nano-scale composites instead of the formation of a homogenous alloy of intercalation material and matrix material.

Thus, to prevent contamination and depositions as well as to reduce the thermal load of the torch body and to better focus the produced plasma jet within the plasma jet source, an enveloping gas cylindrically surrounding the produced plasma, such as hydrogen or argon, may be additionally supplied to the torch body.

Moreover, in the method according to the present invention, plasma jet sources may be used that operate at a pressure of $10^{-4}$ mbar up to 1.5 bar in the process chamber, the plasma being ignited and maintained in the most different manners each conventional, e.g., via d.c. excitation, high-frequency a.c. excitation, microwave excitation, or excitation using unipolar or bipolar voltage pulses.

In addition, it may be possible using the method according to the present invention, to produce different layer systems by changing the layer compositions and/or by varying the layer composition as a function of time or to deposit them on a substrate as a functional coating. Thus, for example, by changing the composition of the precursor materials in the plasma as a function of time, a sequence of partial layers may also be deposited that have a continuous transition into the material composition of the partial layers, and that are made, for example, of a sequence of layers of metal silicides, carbides, oxides, nitrides, borides, sulfides, amorphous to crystalline hydrocarbon or carbon, silicon hydrogen, or of a mixture of these materials.

In this context, this deposition may be performed over a wide temperature range and also at low temperatures.

Furthermore, layers or a sequence of layers are able to be produced that are made of intercalations of metal silicides, metal carbides, metallic oxides, metal nitrides, metal borides, metal sulfides, boron nitrides, or appropriate silicon compounds in matrices of amorphous carbon, amorphous metals, amorphous ceramic-like materials, such as BN, $Si_3N_4$, or of a mixture of these materials.

It is also possible as a result of suitably selecting the process parameters to prepare layers or layer systems having different morphologies and, consequently, different properties even in the case of the same material composition. The amount of supplied precursor materials and their particle size as well as the process pressure and the type, composition, and amount of additionally supplied gases (injector gas, enveloping gas, central gas) are decisive for this. Selecting these parameters makes it possible to prepare amorphous, nano-, micro-, up to coarser crystalline phases in the composite layers.

A further advantage of the method according to the present invention may be the possibility of combining it at least intermittently with conventional and a separately controllable CVD, PVD, or PACVD method in order to deposit combination layers. In this context, on the one hand, a continuously performed CVD, PVD, or PACVD process is able to be intermittently combined with the method according to the present invention, yet, on the other hand, the method according to the present invention may also be continuously run with the CVD, PVD, or PACVD process being at least intermittently switched in. The cyclical employment of both methods is also possible.

In this manner, an amorphous layer may also be deposited as a matrix layer on a substrate, e.g., using a conventional PACVD process, additional nano-scale particles or crystallites being embedded in the matrix layer by cyclically initiating the method according to the present invention. For this purpose, the substrates to be coated may be lead cyclically, e.g., by being arranged on a rotatable support, and in succession past, e.g., at least one PACVD source and at least one plasma jet source, while the different sources each operate continuously.

Example embodiments of the present invention are explained in detail in the following description with reference to the drawings.

DETAILED DESCRIPTION

A plasma jet source 5 described in E. Pfender and C. H. Chang's "Plasma Spray Jets and Plasma-Particulate Interaction: Modelling and Experiments" symposium volume of minutes of plasma technology workshop VI, TU Illmenau, 1998, is suitable for implementing the method according to the present invention.

Figure 1:
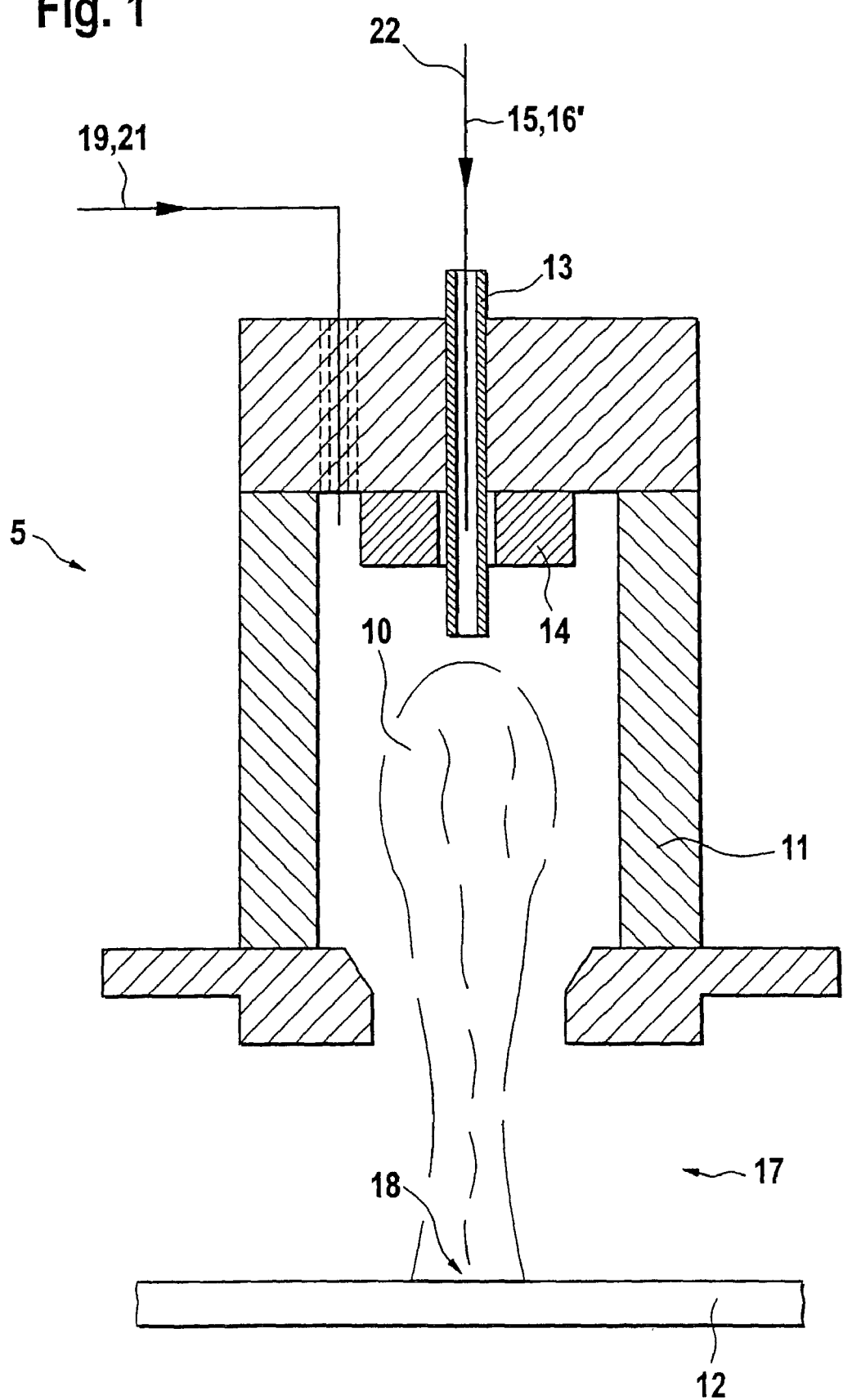
FIG. 1 illustrates a conventional plasma jet source for implementing the method according to the present invention.

According to FIG. 1, an injector gas 15 is axially supplied to this plasma jet source 5 including a cylindrical torch body 11 via a feed inlet 13 and a cylindrical sleeve 14. In this context, a precursor material 16' may also be optionally supplied with injector gas 15. In torch body 11, a plasma 10 is ignited and maintained via an electromagnetic coupling by conventional components, the plasma emerging in the form of a plasma jet 17 from torch body 11 of plasma jet source 5. Torch body 11 is a typical height of about 10 cm. Plasma jet 17 impinges at a distance of typically about 10 cm to 100 cm on a substrate 12, e.g., steel, in order to deposit a layer or a layer system there as a functional coating 18.

Furthermore, it is optionally provided to supply a central gas 22 centrally within sleeve 14. Moreover, a gas feed 21 is provided in the form as a gas shower for optionally concentrically introducing an enveloping gas 19 into torch body 11. For this purpose, enveloping gas 19 is introduced outside of sleeve 14 such that an undesirably strong heating or coating of the inner walls of torch body 11 is prevented. Moreover, a precursor material may also be optionally added to enveloping gas 19.

Figure 2:
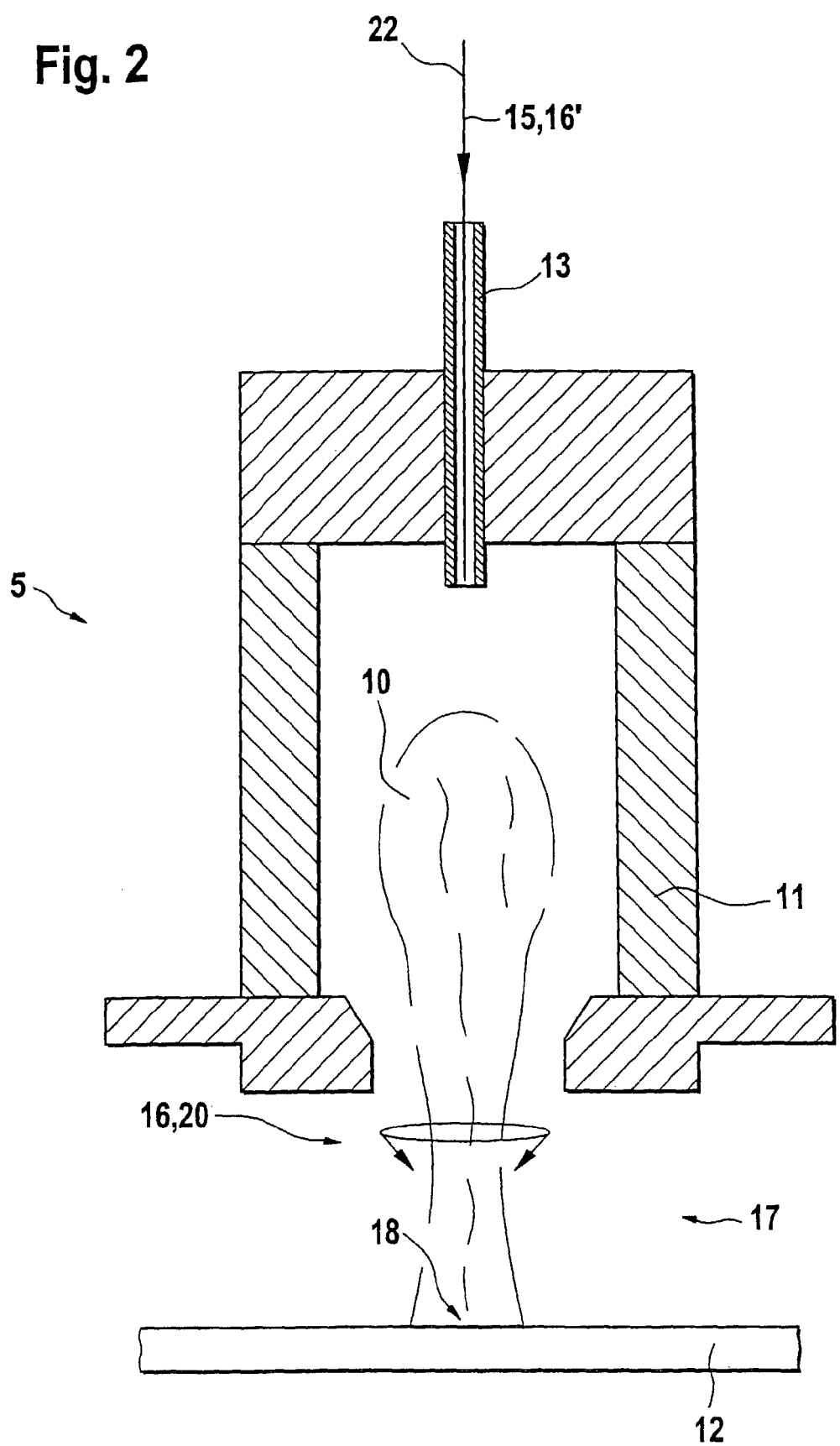
FIG. 2 illustrates a modified plasma jet source having a changed gas control.

FIG. 2 illustrates a modification of the type of construction of plasma jet source 5, the introduction of an enveloping gas 19 and the use of sleeve 14 being eliminated. In FIG. 2, an additional precursor material 16 is supplied, however outside of plasma jet source 5, to plasma 10, which exits torch body 11 as plasma jet 17. For this purpose, an additional shower 20 is provided, which concentrically surrounds plasma jet 17 and may be integrated in a nozzle situated at the outlet of plasma jet source 5, i.e., in the region of the outlet of plasma jet 17 from torch body 11. Using a precursor material 16 introduced by this shower 20 or this nozzle, the magnitude and type of energy transfer from plasma 10 to precursor materials 16, 16' may be lastingly controlled, so that variably large intercalations or variably structured intercalations may be produced in deposited functional coating 18. To control this energy transfer, a quenching gas for cooling may also be supplied to the plasma via shower 20.

Another example embodiment of the method according to the present invention provides in a modification illustrated in FIG. 2 for an axial injection of first precursor material 16' into torch body 11 to be eliminated in that, for example, only a noble gas such as argon or a reactive gas such as oxygen or hydrogen is introduced into torch body 11 as injector gas 15, which then first produces plasma 10 to which one or more precursor materials 16, e.g., in the form of nano-scale or micro-scale powders, are supplied outside of plasma jet source 5 via carrier gases mixed therewith by concentric shower 20.

In the method according to the present invention, plasma 10 interacts with supplied precursor materials 16, 16', these being partially or completely fused, vaporized, or at least superficially activated or fragmented. Fusing or fragmentation to an atomic or molecular level (atoms, molecules, radicals) is possible. In addition, this interaction may also be a chemical reaction induced by plasma 10 of supplied precursor material 16, 16' with a supplied gaseous or fluid reaction component or another precursor material.

The method parameters for operating plasma jet source 5, which are establish individually in preliminary experiments for the functional coating to be deposited, are the power coupled into plasma 10, the type of plasma excitation in torch body 11, the distance between the outlet opening of torch body 11 and substrate 12, the type and amount of supplied precursor materials 16, 16', as well as the pressure at which plasma jet source 5 is operated. A certain minimum power may always be coupled into plasma 10 in order to ensure a minimum power density that is then passed on to layer-forming precursor material 16, 16' via impulses and radiation. Moreover, the residence time of the introduced particles or precursor materials 16, 16' in plasma jet 17 may be influenced by the length of plasma jet 17, the precursor materials in turn absorbing energy from plasma jet 17 during this flight time. A complete break up, for example, of an introduced precursor material 16, 16' to the atomic or molecular level is first ensured when the residence time and consequently the absorbed energy are sufficient.

Further method parameters are the number and quantity of introduced precursor materials 16, 16' and the location of their introduction, as well as the type and quantity of the gases used.

In this context, the supplied gases are either inert gases, such as argon, as plasma gas or injector gas 15 or as enveloping gas 19, carrier gases, such as nitrogen or argon, for supplied precursor materials 16, 16', e.g., as central gas 22, or reactive gases, such as oxygen, nitrogen, ammonia, methane, acetylene, silane, or hydrogen, as chemical reagents with supplied precursor materials 16, 16'. Purely organic, gaseous compounds, such as acetylene or methane, may be suitable for depositing amorphous carbon.

Gaseous organic organosilicon or organometallic compounds, such as hexamethylsilane (HMDS) or tetramethylsilane (TMDS), or also a mixture of these gases are possible precursor materials 16, 16'. In addition, solid precursors are suitable that are supplied as sub-micro or nano-scale particles of metals, such as chrome, titanium, iron, aluminum, zirconium, hafnium, or the like, or particles of hard materials or ceramics from the group of nitrides, e.g., boron nitride, silicon nitride, or metal nitride, such as TiN, oxides, such as aluminum oxide, titanium oxide, or silicon oxide, carbides, such as TiC, silicide, or silicon compounds.

Furthermore, precursor materials 16, 16' may also be supplied in a fluid form, e.g., in the form of suspensions including suspended nano-scale particles from the above material classes.

The explained production of layer systems as functional coating 18 is explained in greater detail in the following using several examples.

In a first example, at least two different precursor materials 16, 16' are supplied to plasma jet 17, of which one is supplied to plasma 10 via feed inlet 13 in a gaseous or fluid form, and the second is introduced via shower 20 as a solid in the form of a nano-scale powder or a suspension of a nano-scale powder. In this context, gaseous or fluid precursor material 16' is chemically modified in plasma jet 17 and forms during deposition on substrate 12 an at least largely amorphous layer as the matrix layer, while second precursor material 16 is partially fused in plasma jet 17 and, consequently, is present in functional coating 18 as an intercalation in the matrix layer. Therefore, different processes are linked with the two different precursor materials 16, 16' within plasma 10, the processes are able to occur simultaneously or also in succession in a coordinated manner.

Otherwise analogous to the first example, a second example provides for the use of fluid or gaseous hydrocarbons or generally organic parent compounds as first precursor material 16' and for the use of solids of metals or ceramics, such as Ti, Cr, Ta, TiN, $TiO_2$, BN, SiN, SiC, TiC, $ZrO_2$, $SiO_2$, $MoS_2$, or $TaS_2$ as second precursor material 16. In this manner, new-type, functional coatings in the form of wear-protecting layers are able to be produced as layers for reducing friction, e.g., in the form of dry lubricants, or for electronic applications.

In a third example, at least three precursor materials 16, 16' are used of which the first is gaseous or fluid, the second is introduced as a solid in the form of a nano-scale powder or a suspension of a nano-scale powder, and the third is introduced as a reactive gas, in some instances together with enveloping gas 19, via gas feed 21 into plasma 10. In this context, gaseous or fluid first precursor material 16' is chemically converted together with the third precursor material in plasma jet 17 and during deposition first forms on substrate 12 an at least largely amorphous layer as the matrix layer in which second precursor material 16, which is supplied analogously to the previous example via shower 20, is embedded.

Fluid or gaseous silicon compounds, such as silane or silicon-hydrocarbon compounds are suitable as the first precursor material, nano-scale solids of ceramics, such as TiN, $TiO_2$, TaN, BN, $Al_2O_3$, or $ZrO_2$, are suitable as the second precursor material, and nitrogen is suitable as the reactive plasma gas. As such, new, super-hard functional coatings having a high layer hardness, e.g., a nano-scale TiN solid intercalation in a thin matrix of a comparatively elastic material, such as $Si_3N_4$, are achieved in a simple manner.

A fourth example provides for a hard-material coating to be produced on substrate 12 in that at least two solid precursors 16, 16' in the form of powders or suspensions are supplied to plasma 10, these powders differing in their particles sizes. A nano-scale powder or a suspension of a nano-scale powder that is broken up or fused in plasma jet 17 to the atomic level and is deposited on substrate 12 as an at least largely amorphous matrix layer is used as first precursor material 16', and a micro-scale powder or a suspension of a micro-scale powder that is not completely fused in plasma jet 17 and is consequently embedded in the form of nano-crystalline or micro-crystalline particles in the simultaneously produced amorphous matrix is used as second precursor material 16. Nano-scale TiN, for example, that is introduced via feed inlet 13 together with the carrier gas argon is suitable as first precursor material 16', while micro-scale WC is introduced together with the carrier gas nitrogen via shower 20 as second precursor material 16. In this manner, highly ductile and wear-resistant hard material/hard metal layers are deposited in this manner, a matrix of $Ti_xN_y$ forming whose composition is controllable via the process conditions, e.g., via the gas flows.

In a fifth example, at least two precursor materials 16, 16', which differ with respect to their vaporization and melting temperatures, are supplied to plasma 10. Therefore, powdered titanium is used first precursor material 16' and powdered SiN as second precursor material 16, for example, the supplied titanium however is activated more strongly in plasma 10 than the SiN, so that a highly ductile ceramic coating forms including—dependent on the process conditions—metallic, significantly hypostoichiometric $TiSi_xN_y$ with x, y$\gg$1 or ceramic TiSiN as the matrix material.

A sixth example provides for acetylene or methane to be supplied as a first precursor material 16' via feed inlet 13 to plasma 10, the precursor material is built up atom for atom in the form of an amorphous carbon matrix layer on substrate 12. At the same time, a micro-scale or nano-scale TiN powder is introduced into plasma 10 as second precursor material 16 via shower 20 or alternatively also via feed inlet 13. In this context, the surface of this powder particle is only partially fused and at the same time chemically activated, so that it is embedded as nano-scale or micro-scale crystallites in the simultaneously deposited amorphous matrix layer, which is used as a skeleton.

The simultaneous deposition of a matrix layer and of particles embedded therein as functional coating 18 on substrate 12 using plasma jet source 5 is explained further in a seventh example embodiment. For this purpose, the reactive gas oxygen is introduced via feed inlet 13, for example, as precursor material 16', while a micro-scale or nano-scale metal powder, such as TiN powder, is introduced together with a carrier gas via gas feed 21 into the produced oxygen plasma. Therefore, in this plasma 10 or in plasma jet 17, the metal, titanium in the present case, is at least partially sputtered off from the TiN powder particles via highly energetic gas components and reacts with the supplied oxygen to form a metallic oxide or a titanium oxide. At the same time, suitably selecting the gas flows and the distance of torch body 11 and substrate 12 may result in even partially fused residues of supplied precursor material 16' being embedded in the form of nano-scale or micro-scale crystallites in the growing matrix layer, so that a $TiO_2$ matrix layer including embedded TiN crystallites is produced in the concrete example.

Additional typical examples of such hard functional coatings 18 are TiN particles in a silicon matrix, or titanium boride, titanium oxide, or chromium boride particles in DLC (diamond-like carbon).

In a variation of the previous example, the precursor material may also be introduced into plasma 10 or plasma jet 17 as a gas or fluid, clusters or nano-particles are then formed in the plasma via impulses and chemical reactions of the resulting gas or fluid molecules, and the clusters or nano-particles having an excited surface and consequently are securely embedded in the simultaneously deposited amorphous matrix layer.

The above-described examples have in common that a plasma 10 is produced in plasma jet source 5 by inductively coupling in a high frequency and supplying an injector gas 15, such as oxygen or hydrogen, in torch body 11. In this context, the coupled-in power is typically approximately 20 kw, the pressure approximately 200 mbar, the gas flow of injector gas 15 approximately 5 slpm (standard liter per minute), the flow of optional central gas 22 and of optional enveloping gas 19, for which, for example, nitrogen, argon, or hydrogen is used, approximately 20 and 70 slpm, respectively, and the distance between the outlet opening of torch body 11 and the substrate approximately 20 cm.

In addition, in the case that a gaseous precursor material 16' is introduced via feed inlet 13, a typical gas flow of 5 slpm is used.

When depositing composite layers as functional coating 18, it was also established that plasmas 10 excited by high frequency coupling-in are suitable for this in comparison with DC methods (direct current), such as high speed flame spraying. In this case, the dwell period of precursor materials 16, 16' supplied to plasma 10 is long so that a high level of efficiency of the chemical modification or of the fusing of precursor materials 16, 16' supplied in the form of powders or suspensions is consequently achieved.

Since depending on the selection of injector gas 15 a chemical reaction of this gas with precursor materials 16, 16' and/or fusing of precursor materials 16, 16' occurs, the selection of injector gas 15 is able to influence the composition of functional coating 18 in a simple and targeted manner.

Finally, it is emphasized that the previous example embodiments are not limited with respect to the concrete form of precursor materials 16 and 16'. They may be gaseous, fluid, or powdery and may also be made of a mixture of different precursor materials. Therefore, precursor material 16, 16' may be, for example, isopropanol or acetone and is able to chemically convert itself in plasma jet 17 or in plasma 10 or to react with injector gas 15. In this context, it is possible to additionally introduce a suspension, or a powder, or a powder mixture as precursor material 16 into plasma jet 17 or plasma 10 via shower 20 or via feed inlet 13.

Further example embodiments of the present invention provide for the previous example embodiments for producing functional coating 18 to be combined with deposition using a conventional CVD process (chemical vapor deposition) or a conventional PVD process (physical vapor deposition). For this purpose, a separately controllable CVD or PVD device is operated at least intermittently together with or alternating with plasma jet source 5 to deposit functional coating 18. As such, an amorphous matrix layer in which intercalations are produced using plasma jet source 5 in the previously described manners via supplied precursor materials is able to be deposited on substrate 12 in a conventional manner, for example, via the CVD device.

Therefore, a CVD process, for example, may be continuously performed while plasma jet source 5 is only intermittently switched in or vice versa.

What is claimed is:

1. A method for producing a functional coating on a substrate, comprising the steps of:
    producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate;
    introducing a first precursor material and a second precursor material into the plasma, the first precursor material and the second precursor material one of modified and fused in the plasma jet and subsequently deposited on the substrate; and
    depositing on the substrate an at least largely amorphous matrix layer including one of nano-scale intercalations, micro-scale intercalations, nano-scale crystallites and micro-scale crystallites contained therein.

2. A method for producing a functional coating on a substrate, comprising the steps of:
    producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate; and
    introducing a first precursor material and a second precursor material into the plasma, the first precursor material and the second precursor material one of modified and fused in the plasma jet and subsequently deposited on the substrate,
    wherein the first precursor material and the second precursor material are introduced in the introducing step at least intermittently into the plasma, the first precursor material including one of a nano-scale powder and a suspension of a nano-scale powder, and the second precursor material including one of a micro-scale powder and a suspension of a micro-scale powder.

3. A method for producing a functional coating on a substrate, comprising the steps of:
    producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate; and
    introducing a first precursor material and a second precursor material into the plasma, the first precursor material and the second precursor material one of modified and fused in the plasma jet and subsequently deposited on the substrate,
    wherein the first precursor material and the second precursor material are introduced into the plasma in the introducing step at least intermittently, the first precursor material being one of gaseous and fluid and forming an at least largely amorphous layer after being deposited on substrate, and the second precursor material including one of a nano-scale powder and a suspension of a nano-scale powder.

4. A method for producing a functional coating on a substrate, comprising the steps of:
    producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate;
    introducing a first precursor material and a second precursor material into the plasma, the first precursor material and the second precursor material one of modified and fused in the plasma jet and subsequently deposited on the substrate; and
    depositing one of a layer and a sequence of layers on the substrate as a coating that includes one of a metal silicide, a metal carbide, a silicon carbide, a metallic oxide, a silicon oxide, a metal nitride, a silicon nitride, a metal boride, a metal sulfide, an amorphous carbon, and a hydrocarbon compound and of a mixture of these materials,
    wherein the sequence of layers is deposited on the substrate in the depositing step as coating via a time-wise change in a composition of at least one of the first precursor material and the second precursor material.

5. A method for producing a functional coating on a substrate, comprising the steps of:
    producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate; and
    introducing a first precursor material and a second precursor material into the plasma, the first precursor material and the second precursor material one of modified and fused in the plasma jet and subsequently deposited on the substrate,
    wherein the first precursor material includes an organic parent compound, and the second precursor material includes one of a powdery solid, a metallic solid and ceramic solid suspended in a fluid.

6. The method according to claim 5, wherein the organic parent compound includes one of a fluid hydrocarbon and a gaseous hydrocarbon.

7. A method for producing a functional coating on a substrate, comprising the steps of:
    producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate;
    introducing a first precursor material and a second precursor material into the plasma, the first precursor material and the second precursor material one of modified and fused in the plasma jet and subsequently deposited on the substrate; and
    introducing nitrogen into the plasma as a reactive gas;
    wherein the first precursor material includes one of a fluid silicon compound and a gaseous silicon compound, and the second precursor material includes a nano-scale ceramic solid.

8. The method according to claim 7, wherein the one of the fluid silicon compound and the gaseous silicon compound includes one of a silane compound and a silicon-hydrocarbon compound.

9. The method according to claim 7, wherein the nano-scale ceramic solid includes one of TiN, $TiO_2$, TaN, BN, TiC, $Al_2O_3$, and $ZrO_2$.

10. A method for producing a functional coating on a substrate, comprising the steps of:
produces a plasma using at least one plasma jet source configured to be operated in a fine vacuum up to an almost atmospheric pressure range by inductively coupling in a high frequency, the plasma emerging from the plasma jet source in the form of a plasma jet and acting on the substrate; and
introducing a first precursor material and a second precursor material into the plasma, the first precursor material and the second precursor material one of modified and fused in the plasma jet and subsequently deposited on the substrate,
wherein the first precursor material and the second precursor material are introduced in the introducing step in the form of one of a powder and a suspension and differ in an average size of powder particles and particles suspended in the suspension.

11. A method for producing a functional coating on a substrate, comprising the steps of:
producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate; and
introducing a first precursor material and a second precursor material into the plasma, the first precursor material and the second precursor material one of modified and fused in the plasma jet and subsequently deposited on the substrate,
wherein the first precursor material includes one of a nano-scale powder and a suspension of a nano-scale powder that is deposited on the substrate as an at least largely amorphous matrix layer, and the second precursor material includes one of a micro-scale powder and a suspension of a micro-scale powder that is not completely fused in the plasma and is deposited in the form of one of nano-crystalline particles and micro-crystalline particles embedded in the amorphous matrix layer.

12. A method for producing a functional coating on a substrate, comprising the steps of:
producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate; and
introducing a first precursor material and a second precursor material into the plasma, the first precursor material and the second precursor material one of modified and fused in the plasma jet and subsequently deposited on the substrate,
wherein the first precursor material includes nano-scale, powdery TiN, the second precursor material includes micro-scale, powdery WC, and a carrier gas includes at least one of nitrogen and argon.

13. The method according to claim 12, wherein the first precursor material is introduced into the plasma in the introducing step via a feed inlet, and the second precursor material is introduced into the plasma in the introducing step via a shower.

14. A method for producing a functional coating on a substrate, comprising the steps of:
producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate;
introducing a first precursor material and a second precursor material into the plasma, the first precursor material and the second precursor material one of modified and fused in the plasma jet and subsequently deposited on the substrate; and
depositing a functional coating including a matrix layer including intercalations, the matrix layer including an elastic material in comparison with the intercalations.

15. The method according to claim 14, wherein the elastic material includes one of hyperstoichiometric and hypostoichiometric $Si_3N_4$.

16. A method for producing a functional coating on a substrate, further comprising the steps of:
producing a plasma using at least one plasma jet source configured to be operated in a fine vacuum up to an almost atmospheric pressure range by inductively coupling in a high frequency, the plasma emerging from the plasma jet source in the form of a plasma jet and acting on the substrate;
introducing a first precursor material and a second precursor material into the plasma, the first precursor material and the second precursor material one of modified and fused in the plasma jet and subsequently deposited on the substrate; and
producing a functional layer by one of using the plasma jet source while switching in one of a CVD process, a PVD process, and a PACVD process at least intermittently for depositing an amorphous matrix layer, and using one of the CVD process, the PVD process, and the PACVD process into which a deposition using the plasma jet source is switched at least intermittently.

17. The method according to claim 16, further comprising the steps of:
continuously operating the plasma jet source and a separate deposition device provided for the one of the CVD process, the PVD process, and the PACVD process; and
moving the substrate between the plasma jet source and the deposition device.

* * * * *